US009202575B2

(12) United States Patent
Yamamoto et al.

(10) Patent No.: US 9,202,575 B2
(45) Date of Patent: Dec. 1, 2015

(54) NONVOLATILE SEMICONDUCTOR MEMORY DEVICE

(71) Applicant: Kabushiki Kaisha Toshiba, Minato-ku (JP)

(72) Inventors: Mayumi Yamamoto, Yokohama (JP); Koki Ueno, Yokohama (JP); Yuzuru Shibazaki, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/096,371

(22) Filed: Dec. 4, 2013

(65) Prior Publication Data

US 2015/0029793 A1 Jan. 29, 2015

(30) Foreign Application Priority Data

Jul. 24, 2013 (JP) ................................ 2013-153834

(51) Int. Cl.
G11C 16/04 (2006.01)
G11C 16/12 (2006.01)
G11C 16/10 (2006.01)
G11C 16/34 (2006.01)

(52) U.S. Cl.
CPC ............ G11C 16/10 (2013.01); G11C 16/0483 (2013.01); G11C 16/12 (2013.01); G11C 16/3427 (2013.01)

(58) Field of Classification Search
CPC . G11C 16/3427; G11C 16/0483; G11C 16/12
USPC .................................................... 365/185.17
See application file for complete search history.

(56) References Cited

U.S. PATENT DOCUMENTS

| 6,504,757 | B1 * | 1/2003 | Hollmer et al. | 365/185.18 |
| 6,859,397 | B2 | 2/2005 | Lutze et al. | |
| 7,623,386 | B2 * | 11/2009 | Dong et al. | 365/185.18 |
| 7,623,387 | B2 * | 11/2009 | Dong et al. | 365/185.18 |
| 7,660,157 | B2 | 2/2010 | Maejima et al. | |
| 7,706,188 | B2 * | 4/2010 | Kim | 365/185.17 |
| 7,952,929 | B2 * | 5/2011 | Kim et al. | 365/185.17 |
| 8,203,883 | B2 | 6/2012 | Fujimura | |

(Continued)

FOREIGN PATENT DOCUMENTS

| JP | 2006-522428 | 9/2006 |
| JP | 2008-103003 | 5/2008 |

(Continued)

Primary Examiner — Hoai V Ho
Assistant Examiner — Roberto Mancera
(74) Attorney, Agent, or Firm — Oblon, McClelland, Maier & Neustadt, L.L.P

(57) ABSTRACT

A nonvolatile semiconductor memory device including: a memory cell array including NAND strings; a plurality of word lines; a plurality of bit lines; a source line; and a control circuit configured to execute a write operation. The control circuit is configured to, when charging an unselected memory string prior to the write operation, execute both first and second charging operations, the first charging operation applying to the bit line connected to the unselected memory string a first voltage and rendering conductive a first select transistor to charge the unselected memory string, and the second charging operation applying to the source line connected to the unselected memory string a second voltage and rendering conductive a second select transistor to charge the unselected memory string, the first and second charging operations being executed at different timings.

19 Claims, 11 Drawing Sheets

(56) References Cited

U.S. PATENT DOCUMENTS

| | | | |
|---|---|---|---|
| 8,300,468 B2 * | 10/2012 | Kim | 365/185.17 |
| 2004/0174748 A1 * | 9/2004 | Lutze et al. | 365/185.28 |
| 2005/0047235 A1 * | 3/2005 | Noh | 365/205 |
| 2005/0226055 A1 * | 10/2005 | Guterman | 365/185.28 |
| 2007/0058432 A1 * | 3/2007 | Hosono | 365/185.11 |
| 2008/0048237 A1 * | 2/2008 | Iwata | 257/314 |
| 2008/0159004 A1 * | 7/2008 | Hemink et al. | 365/185.25 |
| 2008/0186766 A1 * | 8/2008 | Ogura et al. | 365/185.05 |
| 2008/0186776 A1 * | 8/2008 | Kim et al. | 365/185.23 |
| 2008/0198668 A1 * | 8/2008 | Ueno | 365/185.25 |
| 2008/0304324 A1 * | 12/2008 | Nagashima et al. | 365/185.18 |
| 2009/0086542 A1 * | 4/2009 | Lee et al. | 365/185.17 |
| 2009/0268523 A1 * | 10/2009 | Maejima | 365/185.11 |
| 2009/0290422 A1 * | 11/2009 | Cha et al. | 365/185.19 |
| 2010/0054036 A1 * | 3/2010 | Lee et al. | 365/185.03 |
| 2011/0019486 A1 * | 1/2011 | Jang et al. | 365/185.25 |
| 2012/0008419 A1 * | 1/2012 | Ha et al. | 365/185.25 |
| 2013/0107602 A1 * | 5/2013 | Oh et al. | 365/51 |
| 2013/0294166 A1 * | 11/2013 | Ha | 365/185.17 |
| 2014/0301146 A1 * | 10/2014 | Kaza et al. | 365/185.23 |

FOREIGN PATENT DOCUMENTS

| | | |
|---|---|---|
| JP | 2010-518538 | 5/2010 |
| JP | 2011-060377 | 3/2011 |

* cited by examiner

A: Binary Data Storage

B: 4-Level Data Storage

NONVOLATILE SEMICONDUCTOR MEMORY DEVICE

CROSS REFERENCE TO RELATED APPLICATION

This application is based upon and claims the benefit of priority from Japanese Patent Application No. 2013-153834, filed on Jul. 24, 2013, the entire contents of which are incorporated herein by reference.

BACKGROUND

1. Field

Embodiments relate to a nonvolatile semiconductor memory device.

2. Description of the Related Art

A NAND type flash memory is known as a nonvolatile semiconductor memory device that is electrically rewritable and capable of a high degree of integration. A memory cell of the NAND type flash memory includes a charge accumulation layer formed on a semiconductor substrate via a tunnel insulating film, and a control gate stacked on the charge accumulation layer via an inter-gate insulating film. The memory cell stores data in a nonvolatile manner by a charge accumulation state of the charge accumulation layer.

Now, this NAND type flash memory includes NAND strings having the memory cells connected in series therein, and during a write operation to the memory cell, the NAND type flash memory is required to charge a body region of an unselected NAND string. However, when this charging prior to the write operation is not sufficiently performed, there is a risk that voltage application during the subsequent write operation causes an increase in erroneous write to the memory cell in the unselected NAND string.

DETAILED DESCRIPTION

A nonvolatile semiconductor memory device according to an embodiment comprises: a memory cell array configured having NAND strings arranged therein, each of the NAND strings including a memory string configured having a plurality of memory cells connected in series therein and a first select transistor and a second select transistor respectively connected to two ends of the memory string; a plurality of word lines respectively connected to control gate electrodes of the plurality of memory cells; a plurality of bit lines each connected to a first end of the memory string included in the NAND strings via the first select transistor; a source line connected to a second end of the memory string via the second select transistor; and a control circuit configured to execute a write operation for data write, the write operation applying a selected memory cell in a selected memory string with a certain write voltage from a selected word line. The control circuit is configured capable of, when charging an unselected memory string prior to the write operation, executing both of a first charging operation and a second charging operation, the first charging operation applying the bit line connected to the unselected memory string with a first voltage and rendering conductive the first select transistor to charge the unselected memory string, and the second charging operation applying the source line connected to the unselected memory string with a second voltage and rendering conductive the second select transistor to charge the unselected memory string, the first charging operation and the second charging operation being executed at different timings.

Next, a nonvolatile semiconductor memory device according to embodiments will be described with reference to the drawings.

First Embodiment

Figure 1:
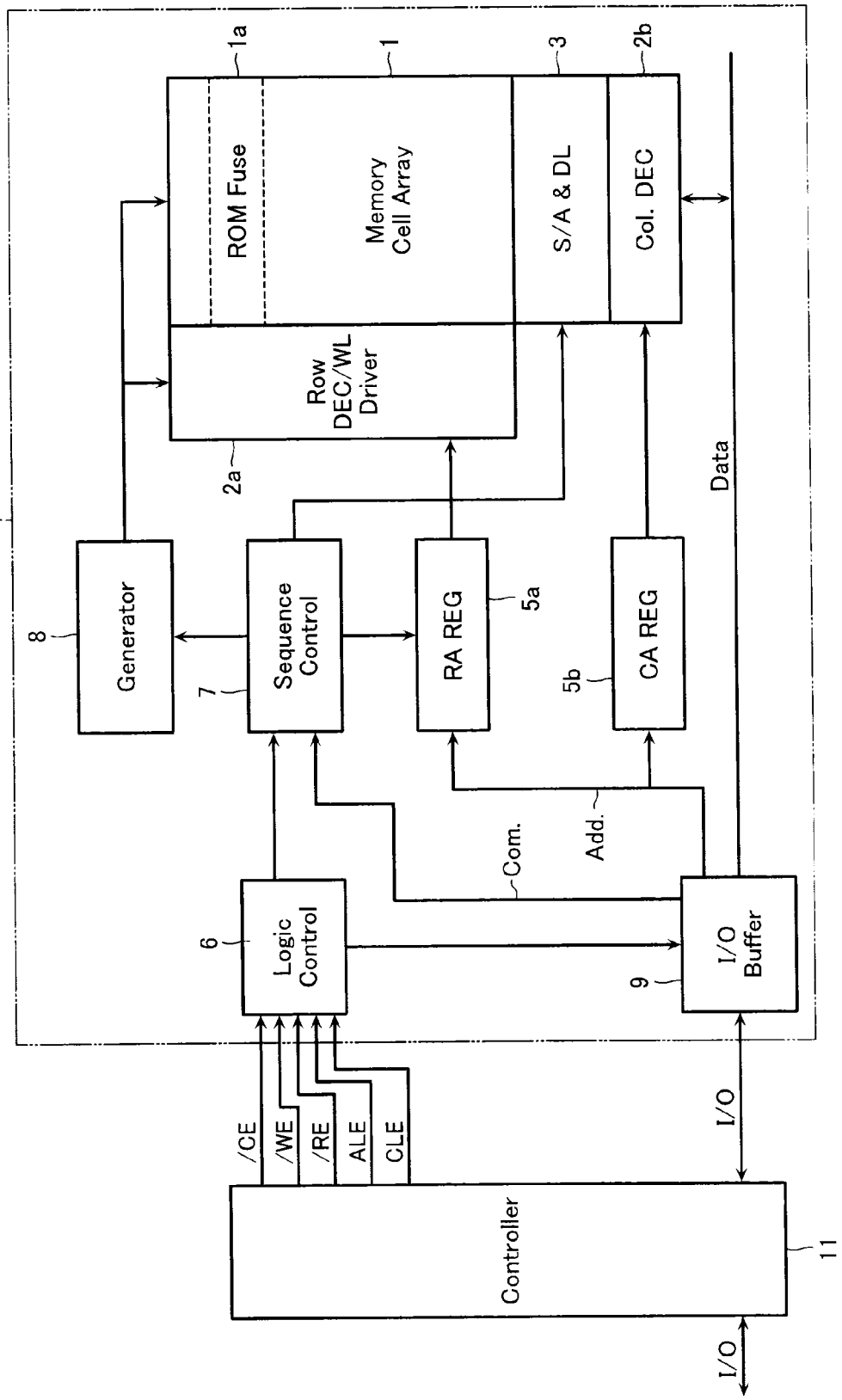
FIG. 1 is a block diagram of a nonvolatile semiconductor memory device according to a first embodiment.

First, an overall configuration of a nonvolatile semiconductor memory device according to a first embodiment will be described. FIG. 1 is a block diagram of the nonvolatile semiconductor memory device according to the present embodiment.

This NAND type flash memory comprises a NAND chip 10 and a controller 11. The controller 11 controls this NAND chip 10. A memory cell array 1 configuring the NAND chip 10 is configured having a plurality of floating gate type memory cells disposed in a matrix therein. Each memory cell includes a charge accumulation layer formed on a semiconductor substrate via a tunnel insulating film, and a control gate stacked on the charge accumulation layer via an inter-gate insulating film. This memory cell array 1 may be provided with a user-inaccessible ROM fuse region 1a, as required.

This ROM fuse region 1a stores various kinds of information required in control of the device during data write, and so on.

Disposed in a periphery of the memory cell array 1 are a row decoder/word line driver 2a, a column decoder 2b, a sense amplifier/latch circuit 3, and a voltage generating circuit 8. These row decoder/word line driver 2a, column decoder 2b, sense amplifier/latch circuit 3, and voltage generating circuit 8 configure a control circuit and perform write or read of data in page units to/from the memory cell array 1.

The row decoder/word line driver 2a drives a word line and a select gate line of the memory cell array 1. The sense amplifier/latch circuit 3 comprises a 1-page portion of sense amplifier circuits and data holding circuits. A 1-page portion of read data of the sense amplifier/latch circuit 3 is sequentially column-selected by the column decoder 2b to be outputted to an external I/O terminal via an I/O buffer 9. Write data provided from the I/O terminal is selected by the column decoder 2b to be loaded into the sense amplifier/latch circuit 3. The sense amplifier/latch circuit 3 has a 1-page portion of write data loaded therein. A row address signal and a column address signal are inputted via the I/O buffer 9 to be respectively transferred to the row decoder 2a and the column decoder 2b. In an erase operation, a row address register 5a holds an erase block address, and in a write operation or a read operation, the row address register 5a holds a page address. A column address register 5b is inputted with a lead column address for write data load before start of the write operation, or a lead column address for the read operation. The column address register 5b holds the inputted column address until a write enable signal /WE or a read enable signal /RE is changed by a certain condition.

A logic control circuit 6 controls input of a command or an address, and input/output of data based on control signals such as a chip enable signal /CE, a command latch enable signal CLE, an address latch enable signal ALE, the write enable signal /WE, the read enable signal /RE, and so on. The read operation or write operation are executed by a command. On receiving the command, a sequence control circuit 7 performs sequence control of the read operation or of write or erase. The voltage generating circuit 8 is controlled by the sequence control circuit 7 to generate a certain voltage required in various operations.

The controller 11 executes control of write and read of data by conditions appropriate to a present write state of the NAND chip 10. Note that part of the later-described write operation may be configured to be performed on a NAND chip 10 side.

[Memory Cell Array]

Figure 2:
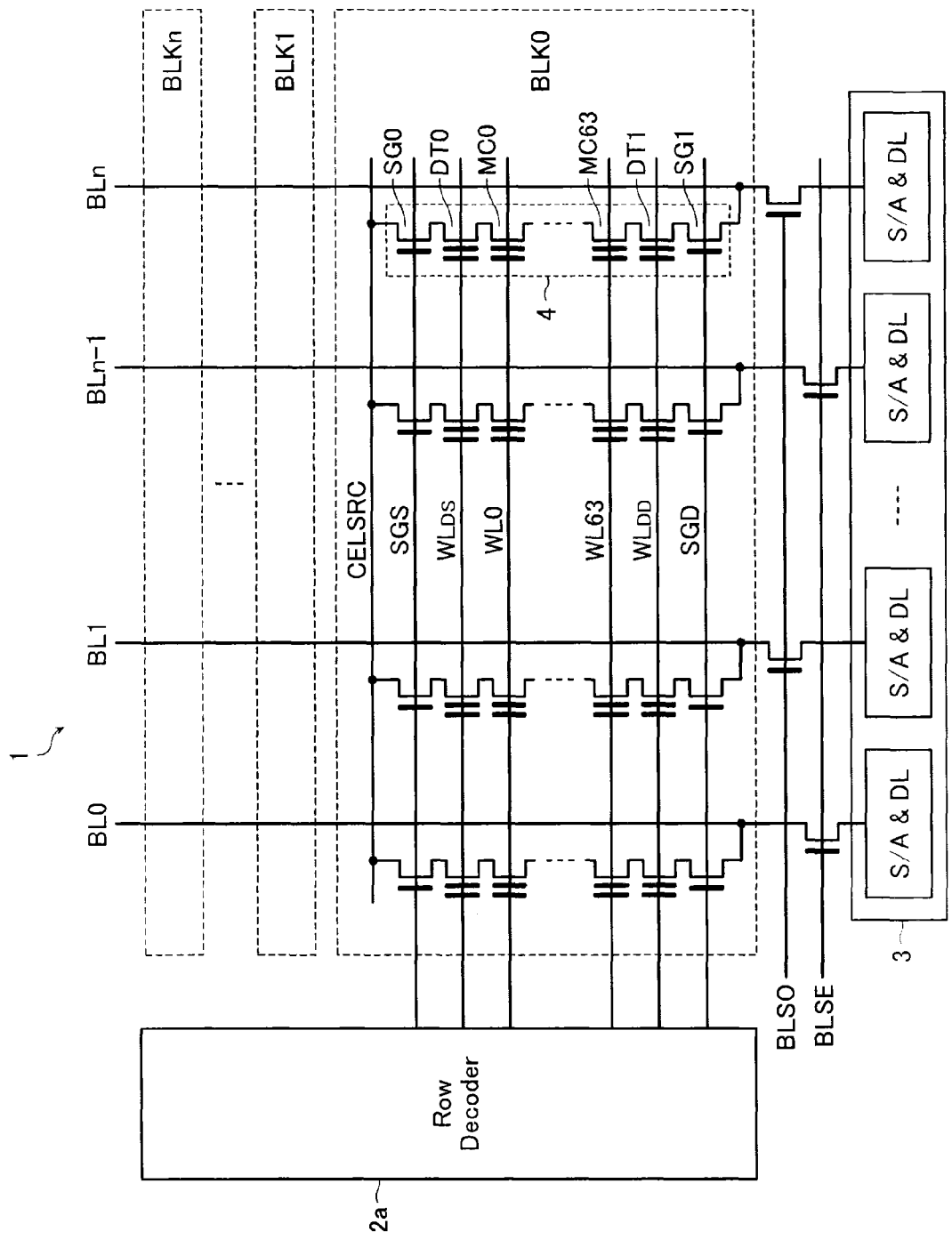
FIG. 2 is a circuit diagram showing a memory cell array and peripheral circuits of the nonvolatile semiconductor memory device according to the first embodiment.
Figure 3:
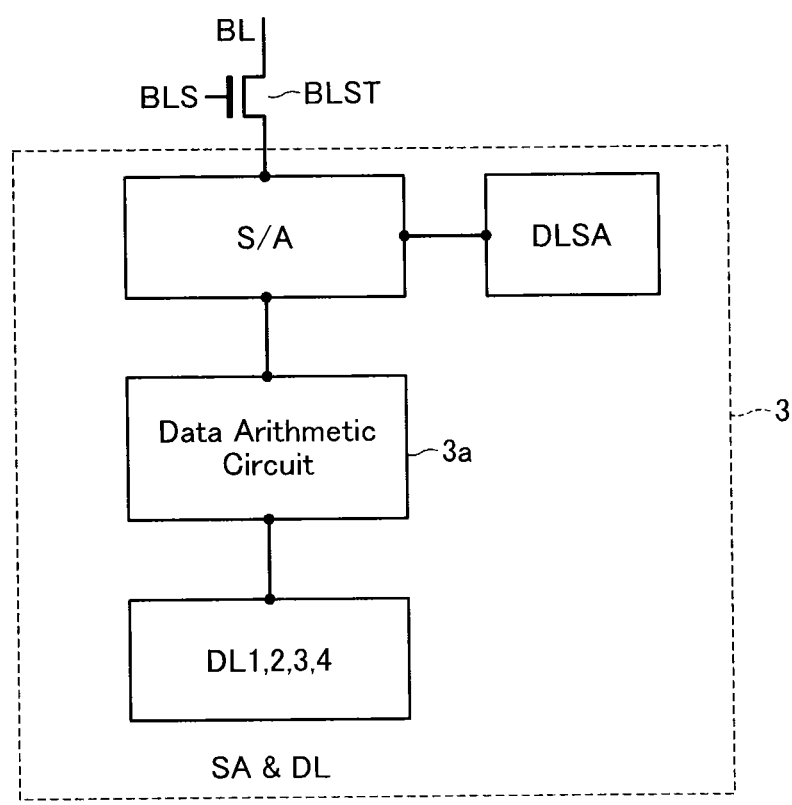
FIG. 3 is a block diagram of the nonvolatile semiconductor memory device according to the first embodiment.
Figure 4:
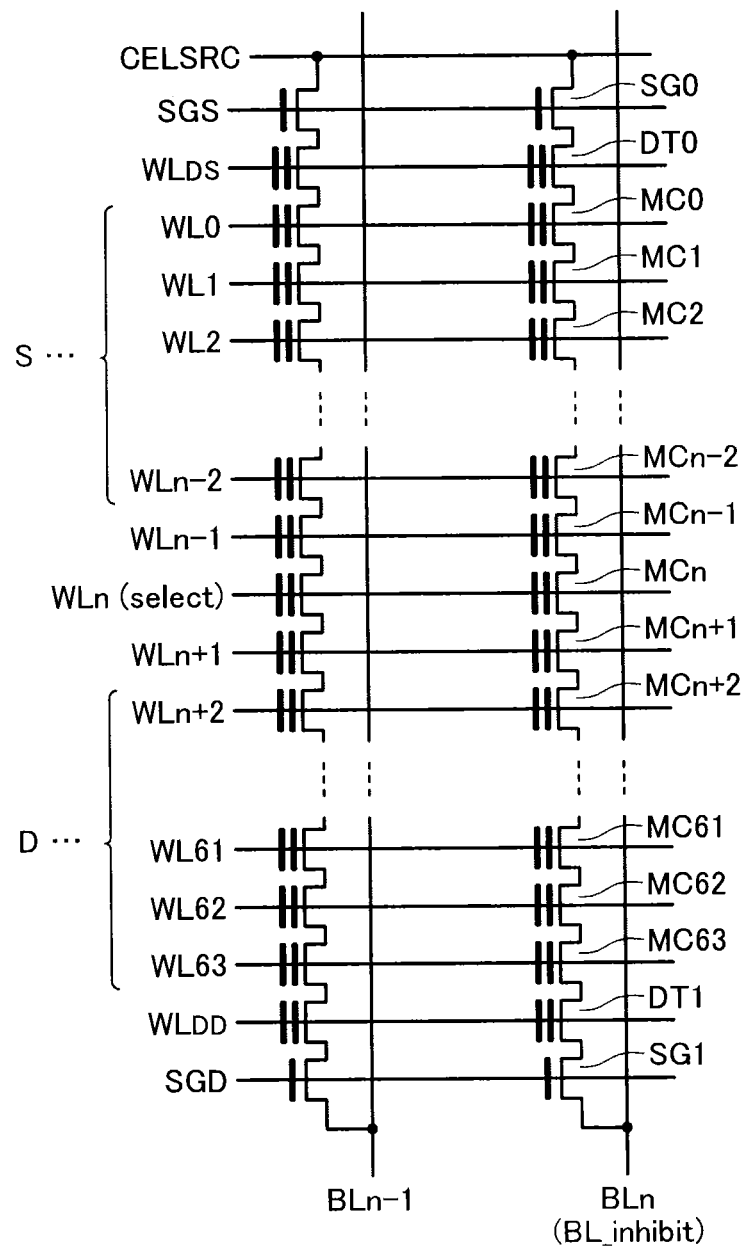
FIG. 4 is a circuit diagram showing the memory cell array of the nonvolatile semiconductor memory device according to the first embodiment.

Next, the memory cell array 1 and the sense amplifier/latch circuit 3 of the nonvolatile semiconductor memory device according to the present embodiment will be described. FIG. 2 is a circuit diagram showing the memory cell array 1 and peripheral circuits. FIG. 3 is a block diagram showing a configuration of the sense amplifier/latch circuit 3. FIG. 4 is a circuit diagram showing the memory cell array 1.

As shown in FIGS. 2 and 4, a NAND string 4 is configured by: 64 series-connected memory cells MC0 to MC63; dummy transistors DT0 and DT1 connected to the two ends of the memory cells; and select gate transistors SG0 and SG1 further connected to the two ends of the memory cells/dummy transistors. A source of the select gate transistor SG0 is connected to a common source line CELSRC, and a drain of the select gate transistor SG1 is connected to a bit line BL (BL0 to BLn). Control gate electrodes of the memory cells MC0 to MC63 are respectively connected to word lines WL (WL0 to WL63). Gate electrodes of the dummy transistors DT0 and DT1 are connected to dummy word lines WLDS and WLDD, and gate electrodes of the select gate transistors SG0 and SG1 are connected to select gate lines SGS and SGD.

A range of the plurality of memory cells MC along one word line WL configures a page which is a unit of batch read and write of data. In addition, a range of the plurality of NAND strings 4 aligned in a word line WL direction configures a block BLK which is a unit of batch erase of data. In FIG. 2, a plurality of blocks BLK0 to BLKn sharing the bit line BL are arranged in a bit line BL direction to configure the memory cell array 1. The word line WL, the dummy word lines WLDS and WLDD, and the select gate lines SGS and SGD are driven by the row decoder 2a.

As shown in FIG. 3, the bit lines BL are each connected to a sense amplifier circuit S/A included in the sense amplifier/latch circuit 3. A bit line select transistor BLST is connected between the bit line BL and the sense amplifier circuit S/A. A bit line select line BLS is connected to a gate electrode of the bit line select transistor BLST. As shown in FIG. 2, even-numbered bit lines BL are connected to the sense amplifier circuits S/A via bit line select transistors BLST connected to an even-numbered bit line select line BLSE. Odd-numbered bit lines BL are connected to the sense amplifier circuits S/A via bit line select transistors BLST connected to an odd-numbered bit line select line BLSO. By selecting one of the even-numbered bit line select line BLSE and the odd-numbered bit line select line BLSO to render the bit line select transistors BLST conductive, it is also possible to configure a page having half of the plurality of memory cells MC along one word line WL as a unit.

As shown in FIG. 3, the sense amplifier/latch circuit 3 includes a data latch circuit DLSA, a data arithmetic circuit 3a, and data latch circuits DL1 to DL4, in addition to the sense amplifier circuit S/A. During the read operation, the sense amplifier circuit S/A detects a voltage of the bit line BL to read data of the memory cell MC in the NAND string 4 connected to the bit line BL. The data latch circuit DLSA is provided connected to the sense amplifier circuit S/A and holds a sense result. The data latch circuits DL1 to DL4 are configured capable of holding certain data. The data arithmetic circuit 3a functions to perform a logical operation between data detected by the sense amplifier circuit S/A and data held by the data latch circuits DL1 to DL4, and to perform control of transferring data of a plurality of the data latch circuits DL1 to DL4.

During the later-described write operation in the memory cell array 1 shown in FIG. 4, it is assumed that a word line WLn is selected. In addition, it is assumed that the NAND string 4 connected to a bit line BLn−1 is a selected NAND string, and that the write operation is performed on a memory cell MCn in the selected NAND string. Moreover, it is assumed that those of the word lines WL from the selected word line WLn to the dummy word line WLDS excluding the selected word line WLn and a word line WLn−1 adjacent to the selected word line WLn are included in a range S. The word lines WL included in the range S are from the word line WL0 to a word line WLn−2. Moreover, it is assumed that those of the word lines WL from the selected word line WLn to the dummy word line WLDD excluding the selected word line WLn and a word line WLn+1 adjacent to the selected word line WLn are included in a range D. The word lines WL included in the range D are from a word line WLn+2 to the word line WL63.

[Data Storage States of Memory Cell]

Figure 5:
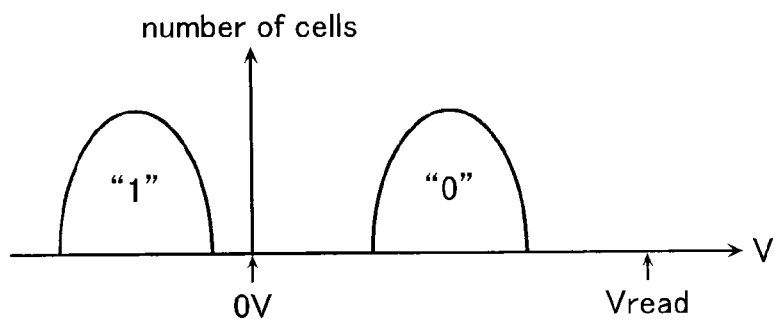
FIG. 5 is a view showing threshold voltage distributions of a memory cell in the nonvolatile semiconductor memory device according to the first embodiment.
Figure 5:
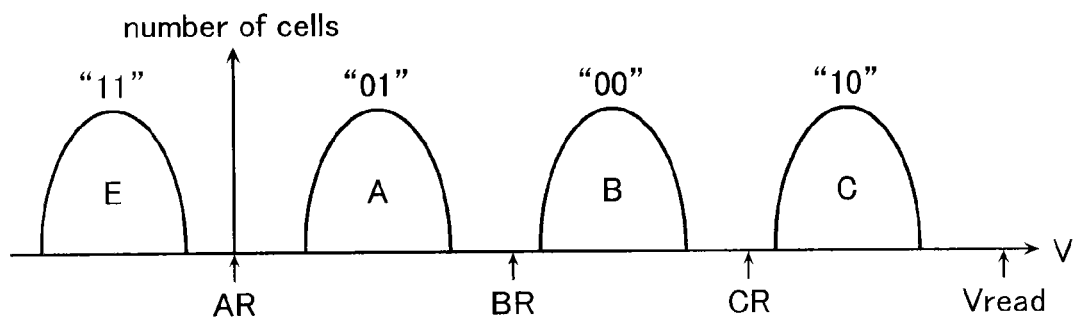

Next, data storage states of the memory cell in the NAND type flash memory according to the present embodiment will be described. FIG. 5 is a view showing threshold voltage distributions of the memory cell MC in the NAND type flash memory according to the present embodiment.

In the case where the memory cell MC in the NAND type flash memory stores binary data (1 bit/cell), threshold voltage distributions of data are as in A: Binary Data Storage in FIG. 5. A state where a threshold voltage is negative configures data "1" (erase state), and a state where a threshold voltage is positive configures data "0".

Moreover, in the case where the memory cell MC in the NAND type flash memory stores 4-level data (2 bits/cell), threshold voltage distributions of data are as in B: 4-Level Data Storage in FIG. 5. In this case, from a lowest threshold voltage, four kinds of threshold voltage distributions (E, A, B, and C) are provided. Allocated to these threshold voltage distributions are four types of data, namely, "11", "01", "00", and "10". Now, the threshold voltage distribution E is a negative threshold voltage state obtained by batch block erase during the erase operation. In addition, voltages AR, BR, and CR between each of the threshold voltage distributions are determination voltages during the read operation and during a verify operation. Moreover, a voltage Vread is a voltage which is higher than an upper limit of the highest threshold voltage distribution C. This read pass voltage Vread is a voltage applied to an unselected word line WL during the read operation.

[Write Operation]

Figure 6:
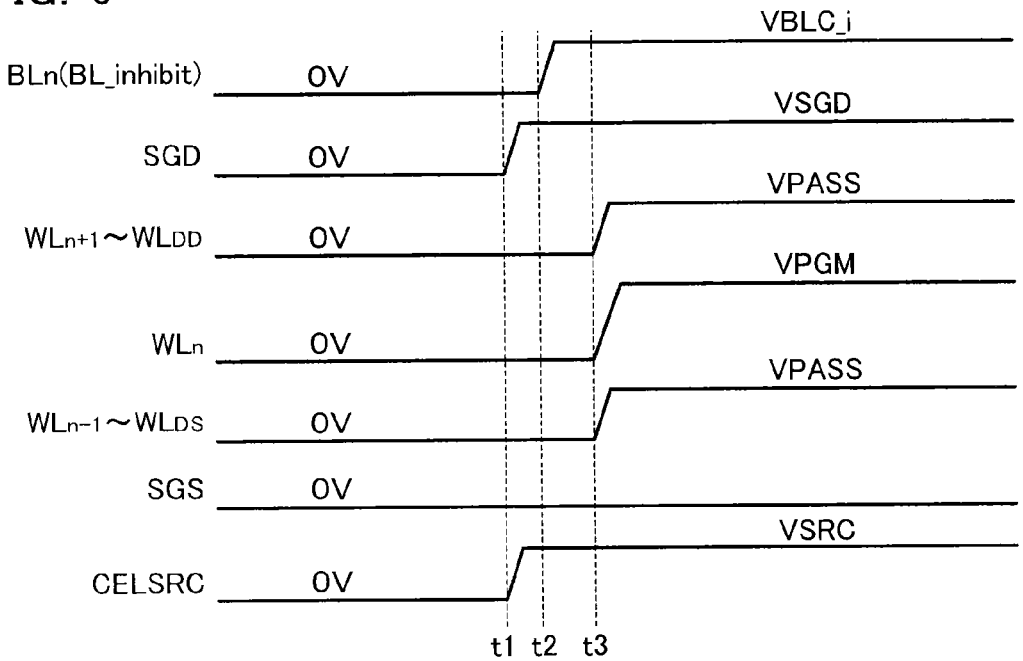
FIG. 6 is a timing chart explaining a write operation of a nonvolatile semiconductor memory device according to a comparative example.
Figure 7:
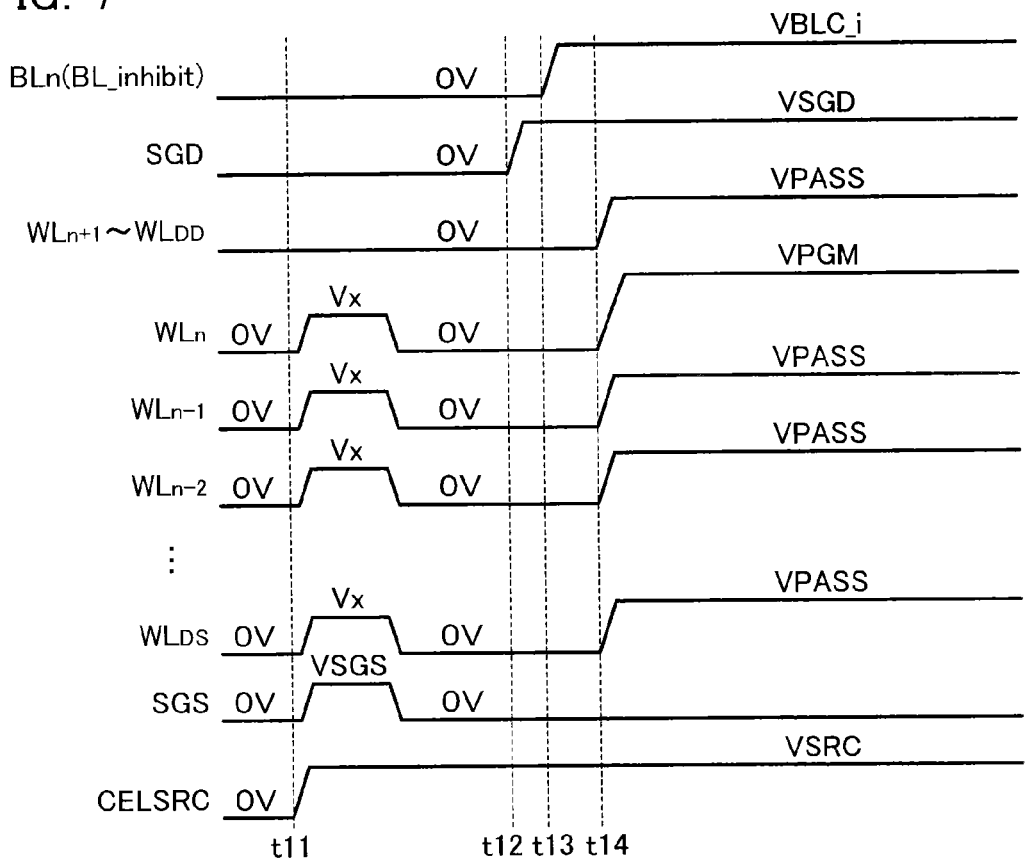
FIG. 7 is a timing chart explaining a write operation of the nonvolatile semiconductor memory device according to the first embodiment.

Next, the write operation of the nonvolatile semiconductor memory device according to the first embodiment will be described with reference to FIGS. 6 and 7. FIGS. 6 and 7 are timing charts respectively explaining write operations according to a comparative example and the present embodiment. First, the write operation of the comparative example will be described with reference to FIG. 6, and then the write operation according to the present embodiment will be described with reference to FIG. 7.

FIGS. 6 and 7 describe the case where, of the NAND strings 4 in the memory cell array 1 shown in FIG. 4, it is the NAND string 4 connected to the bit line BLn−1 that is adopted as a write target. In this case, the memory cell MCn in the selected NAND string 4 undergoes write.

When performing the write operation, a body of an unselected NAND string 4 connected to an unselected bit line BLn (and unselected bit lines BL not illustrated) is charged. As shown in FIG. 6, first, at time t1, the select gate line SGD is applied with a voltage VSGD. At this time, the common source line CELSRC is applied with a voltage VSRC. Next, at time t2, the bit line BLn connected to the unselected NAND string 4 is applied with a voltage VBLC_i. This voltage application causes the select gate transistor SG1 to be rendered conductive, and a current to flow from a bit line BL side, whereby the body of the unselected NAND string 4 is charged. At this time, the select gate line SGS is not applied with a voltage, hence the select gate transistor SG0 is in a non-conductive state.

Now, although omitted from FIG. 6, when writing data to the selected memory cell MCn of the selected NAND string, a voltage of the bit line BLn−1 is set to 0 V, and when holding data of the selected memory cell MCn unchanged, the voltage of the bit line BLn−1 is set to the voltage VBLC_i.

Next, at time t3, the unselected word lines WL and the dummy word lines WLDS and WLDD are applied with a write pass voltage VPASS, and the selected word line WLn is applied with a write voltage VPGM. Now, if a voltage of the selected word line WLn is set to the write voltage VPGM, then a gate electrode of the memory cell MCn included in the unselected NAND string 4 is also applied with the write voltage VPGM. However, a voltage of the body of the unselected NAND string 4 is charged, hence the charge accumulation layer of the memory cell MCn included in the unselected NAND string 4 is not applied with a high voltage, and the write operation is not executed.

When writing data to the selected memory cell MCn included in the selected NAND string 4, a voltage of the body of the NAND string 4 in which the selected memory cell MCn is included is discharged to 0 V. Therefore, the charge accumulation layer of the selected memory cell MCn is applied with a high voltage, and the write operation is executed on the selected memory cell MCn. On the other hand, when holding data unchanged, the body of the selected memory cell MCn is charged, hence the charge accumulation layer of the selected memory cell MCn is not applied with a high voltage, and the write operation is not executed on the selected memory cell MCn.

In the write operation of the comparative example explained by this FIG. 6, when charging the unselected NAND string 4, the voltage VBLC_i of the bit line BL is used to execute a charging operation from the bit line BL side, that is, from a drain side. In this case, there is a risk that according to a state of the memory cell MC, the unselected NAND string 4 is not sufficiently charged, and that at a time of subsequent application of the write voltage VPGM, an erroneous write occurs to the memory cell MCn in the unselected NAND string 4.

In response to this problem, the nonvolatile semiconductor memory device according to the present embodiment executes a write operation of the kind described below. The write operation of the nonvolatile semiconductor memory device according to the present embodiment will be described below with reference to FIG. 7.

As shown in FIG. 7, when performing the write operation of the present embodiment too, the body of the unselected NAND string 4 connected to the unselected bit line BLn (and unselected bit lines BL not illustrated) is charged. In the write operation of the present embodiment, when charging the unselected NAND string 4, the voltage VSRC of the common source line CELSRC is used to execute the charging operation from a common source line CELSRC side, that is, from a source side.

First, at time t11, the common source line CELSRC is applied with the voltage VSRC. In addition, the select gate line SGS is applied with a voltage VSGS, and the selected word line WLn, the unselected word line WLn−1 adjacent to the selected word line WLn, the unselected word lines WLn−2 to WL0 included in the range S of FIG. 4, and the dummy word line WLDS are applied with a voltage Vx. This voltage application causes the select gate transistor SG0 to be rendered conductive, and a current to flow from the common source line CELSRC side, whereby the body of the unselected NAND string 4 is charged. At this time, the select gate line SGD is not applied with a voltage, hence the select gate transistor SG1 is in a non-conductive state. Then, the select gate line SGS, the selected word line WLn, the unselected word line WLn−1, the unselected word lines WLn−2 to WL0 included in the range S, and the dummy word line WLDS are discharged. Note that the common source line CELSRC is maintained at the voltage VSRC.

Next, at time t12, the select gate line SGD is applied with the voltage VSGD. Moreover, at time t13, the bit line BLn connected to the unselected NAND string 4 is applied with the voltage VBLC_i. This voltage application causes the select gate transistor SG1 to be rendered conductive, and a current to flow from the bit line BL side, whereby the body of the unselected NAND string 4 is charged. At this time, the select gate line SGS is not applied with a voltage, hence the select gate transistor SG0 is in a non-conductive state.

The operation at time t14 and after is similar to the write operation of the comparative example explained using FIG. 6. In this case too, the voltage of the body of the unselected NAND string 4 is charged, hence even if the selected word line WLn is applied with the write voltage VPGM, the charge accumulation layer of the memory cell MCn included in the unselected NAND string 4 is not applied with a high voltage, and the write operation is not executed.

[Advantages]

Due to the write operation of the present embodiment shown in FIG. 7, when charging the unselected NAND string 4 connected to the bit line BLn, the voltage VSRC of the common source line CELSRC is used to execute the charging operation from the common source line CELSRC side, that is, from the source side. Then, at a different timing to the charging operation from the source side, the voltage VBLC_i of the bit line BL is used to execute the charging operation on the unselected NAND string 4 from the bit line BL side, that is, from the drain side, too. Such a charging operation enables the body of the unselected NAND string 4 to be sufficiently charged, regardless of a state of the unselected NAND string 4, that is, regardless of data held in the memory cell MC in the unselected NAND string 4, and so on. As a result, erroneous write to the memory cell MC in the unselected NAND string 4 can be suppressed.

Moreover, a voltage applied to the select gate transistors SG0 and SG1 is common to the charging operation from the bit line BL side and the write operation. Therefore, when executing in the order of the charging operation from the common source line CELSRC side, the charging operation from the bit line BL side, and the write operation, there is no need to change the voltage applied to the select gate transistors SG0 and SG1 when shifting from the charging operation from the bit line BL side to the write operation, hence an operation time can be reduced.

Another Example of Embodiment

Next, another example of the present embodiment will be described with reference to FIG. 8.

When performing the write operation of the present example too, the body of the unselected NAND string 4 connected to the unselected bit line BLn (and unselected bit lines BL not illustrated) is charged. The write operation of the present example differs from the operation of the embodiment shown in FIG. 7 in that in the write operation of the present example, when the voltage VSRC of the common source line CELSRC is used to execute the charging operation from the common source line CELSRC side, that is, from the source side, a portion of the word lines WL are not applied with a voltage.

Figure 8:
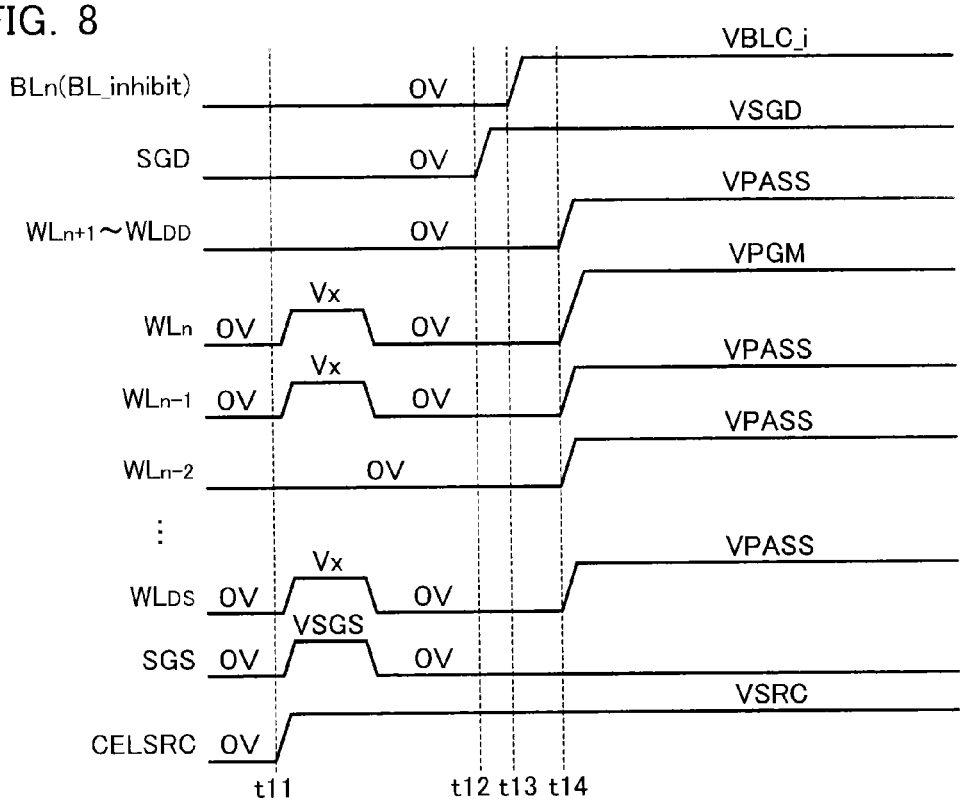
FIG. 8 is a timing chart explaining a write operation of a nonvolatile semiconductor memory device according to another example of the first embodiment.

As shown in FIG. 8, at time t11, the common source line is applied with the voltage VSRC. In addition, the select gate line SGS is applied with the voltage VSGS, and the selected word line WLn, the unselected word line WLn−1 adjacent to the selected word line WLn, and the dummy word line WLDS are applied with the voltage Vx. At this time, at least a portion of the unselected word lines WLn−2 to WL0 included in the range S are not applied with the voltage Vx. In other respects, the operation is similar to the operation of the embodiment shown in FIG. 7. Such a voltage application too causes the select gate transistor SG0 to be rendered conductive, and a current to flow from the common source line CELSRC side, whereby the body of the unselected NAND string 4 is charged.

[Advantages]

In the write operation of the example shown in FIG. 8 too, when charging the unselected NAND string 4 connected to the bit line BLn, the voltage VSRC of the common source line CELSRC is used to execute the charging operation from the common source line CELSRC side, that is, from the source side. Depending on a state of the memory cell MC included in the range S, the NAND string 4 can be charged without the word line WL being applied with a voltage. Therefore, the charging operation as in the present example also enables the body of the unselected NAND string 4 to be sufficiently charged.

Second Embodiment

Next, a second embodiment of the present invention will be described with reference to FIG. 9. An overall configuration of a nonvolatile semiconductor memory device of the second embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. In the present embodiment, control when performing the charging operation on the unselected NAND string 4 from the bit line BL side, that is, from the drain side, differs from that in the first embodiment. The write operation of the nonvolatile semiconductor memory device according to the present embodiment will be described below with reference to FIG. 9.

When performing the write operation of the present embodiment too, the body of the unselected NAND string 4 connected to the unselected bit line BLn (and unselected bit lines BL not illustrated) is charged. As shown in FIG. 9, first, at time t21, the common source line is applied with the voltage VSRC. In addition, the select gate line SGS is applied with the voltage VSGS, and the selected word line WLn, the unselected word line WLn−1 adjacent to the selected word line WLn, the unselected word lines WLn−2 to WL0 included in the range S, and the dummy word line WLDS are applied with the voltage Vx. This voltage application causes the select gate transistor SG0 to be rendered conductive, and a current to flow from the common source line CELSRC side, whereby the body of the unselected NAND string 4 is charged. At this time, the select gate line SGD is not applied with a voltage, hence the select gate transistor SG1 is in a non-conductive state.

Next, at time t22, the select gate line SGS, the selected word line WLn, the unselected word line WLn−1, the unselected word lines WLn−2 to WL0 included in the range S, and the dummy word line WLDS are discharged. Note that the common source line CELSRC is maintained at the voltage VSRC. Additionally at time t22, the select gate line SGD is applied with the voltage VSGD, and the unselected word line WLn+1 adjacent to the selected word line WLn, the unselected word lines WLn+2 to WL63 included in the range D, and the dummy word line WLDD are applied with the voltage Vx.

Next, at time t23, the bit line BLn connected to the unselected NAND string 4 is applied with the voltage VBLC_i. This voltage application causes the select gate transistor SG1 to be rendered conductive, and a current to flow from the bit line BL side, whereby the body of the unselected NAND string 4 is charged. At this time, the select gate line SGS is not applied with a voltage, hence the select gate transistor SG0 is in a non-conductive state. Then, the unselected word line WLn+1, the unselected word lines WLn+2 to WL63 included in the range D, and the dummy word line WLDD are discharged.

The operation at time t24 and after is similar to the write operation of the comparative example explained using FIG. 6. In this case too, the voltage of the body of the unselected NAND string 4 is charged, hence even if the selected word line WLn is applied with the write voltage VPGM, the charge accumulation layer of the memory cell MCn included in the unselected NAND string 4 is not applied with a high voltage, and the write operation is not executed.

[Advantages]

Figure 9:
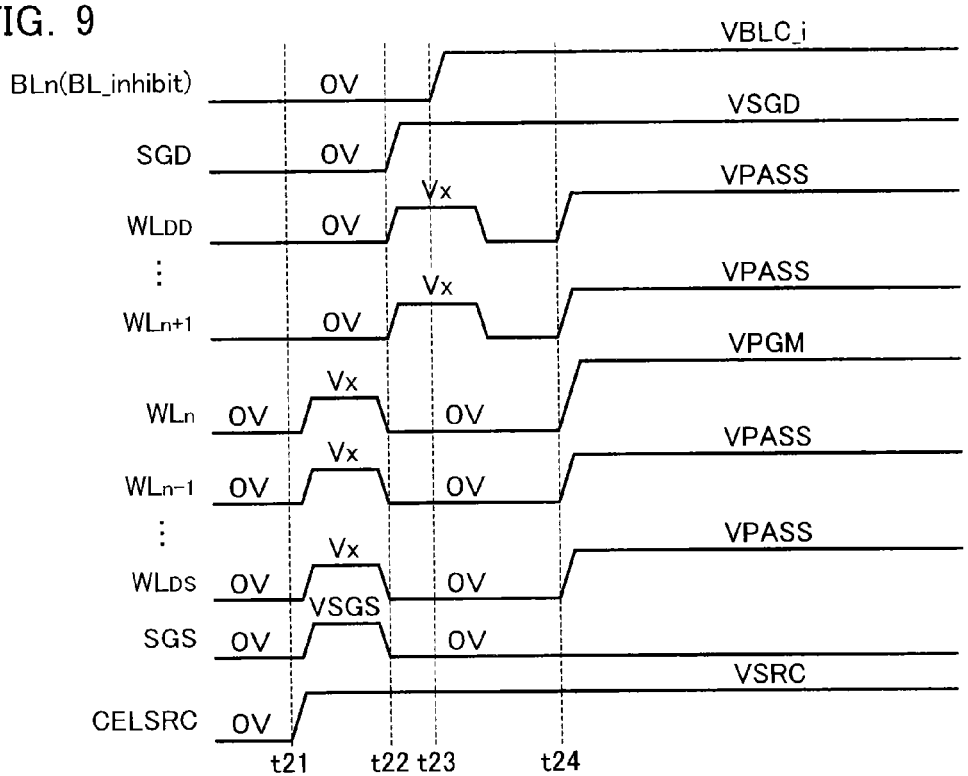
FIG. 9 is a timing chart explaining a write operation of a nonvolatile semiconductor memory device according to a second embodiment.

Due to the write operation of the present embodiment shown in FIG. 9, when charging the unselected NAND string 4 connected to the bit line BLn, the voltage VSRC of the common source line CELSRC is used to execute the charging operation from the common source line CELSRC side, that is, from the source side. Then, at a different timing to the charging operation from the source side, the voltage VBLC_i of the bit line BL is used to execute the charging operation on the unselected NAND string 4 from the bit line BL side, that is, from the drain side, too. Such a charging operation enables the body of the unselected NAND string 4 to be sufficiently charged, regardless of a state of the unselected NAND string 4, that is, regardless of data held in the memory cell MC in the unselected NAND string 4, and so on. As a result, erroneous write to the memory cell MC in the unselected NAND string 4 can be suppressed.

Now, there is a risk that when the voltage VSRC applied to the common source line CELSRC is about as high as the voltage VBLC_i applied to the unselected bit line BLn, current consumption for charging of the common source line CELSRC increases. As shown in the present embodiment, by staggering timings when the select gate transistor SG0 and the select gate transistor SG1 are rendered conductive, a penetration current can be prevented from flowing from the unselected bit line BLn to the common source line CELSRC, even when the voltage VSRC applied to the common source line CELSRC is set to a value which is smaller than that of the voltage VBLC_i applied to the unselected bit line BLn.

Another Example of Embodiment

Next, another example of the present embodiment will be described with reference to FIG. 10.

Figure 10:
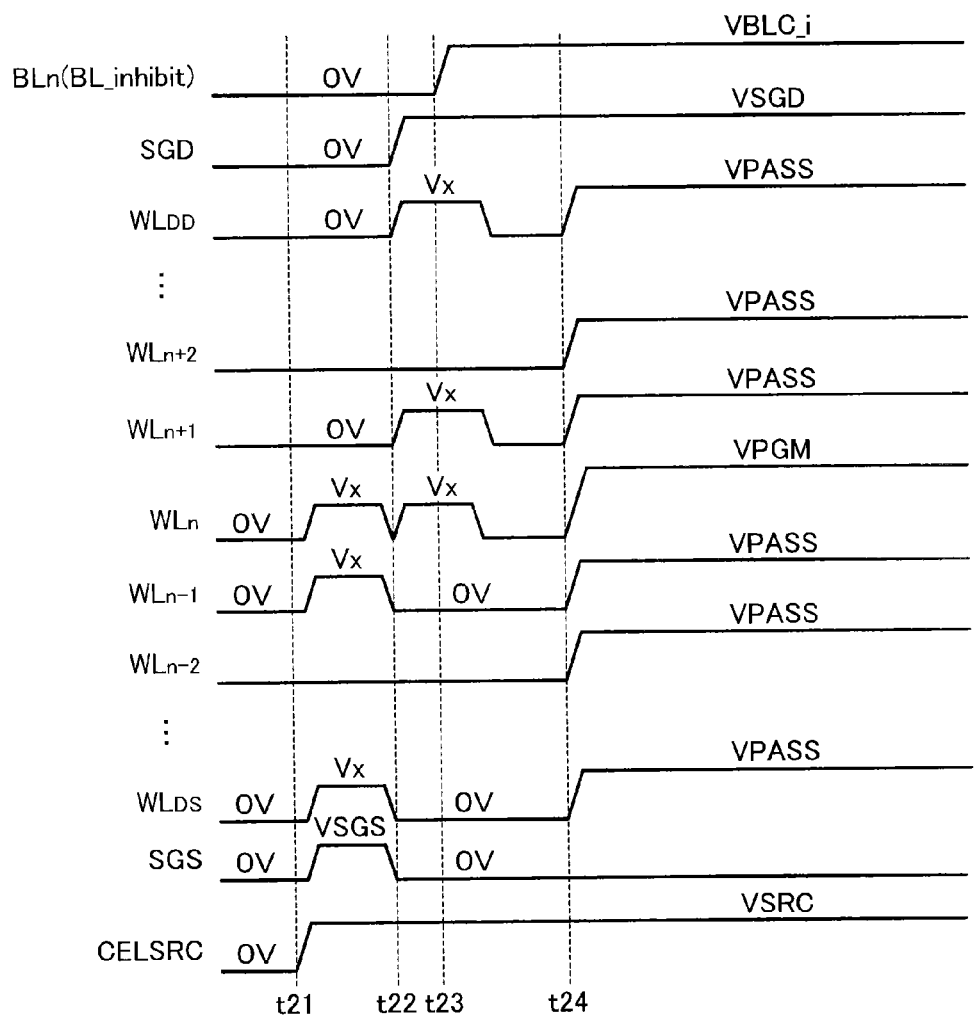
FIG. 10 is a timing chart explaining a write operation of a nonvolatile semiconductor memory device according to another example of the second embodiment.

The write operation of the example shown in FIG. 10 differs from the operation of the embodiment shown in FIG. 9 in that in the write operation of the example shown in FIG. 10, when the voltage VSRC of the common source line CELSRC is used to execute the charging operation from the common source line CELSRC side, that is, from the source side, a portion of the word lines WL are not applied with a voltage, and, when the voltage VBLC_i of the bit line BLn is used to execute the charging operation from the bit line BLn side, that is, from the drain side, a portion of the word lines WL are not applied with a voltage. Moreover, the write operation of the example shown in FIG. 10 differs from the operation of the embodiment shown in FIG. 9 also in that in the write operation of the example shown in FIG. 10, in both the case of executing the charging operation from the source side and the case of executing the charging operation from the drain side, the selected word line WLn is applied with the voltage Vx.

As shown in FIG. 10, at time t21, the common source line is applied with the voltage VSRC. In addition, the select gate line SGS is applied with the voltage VSGS, and the selected word line WLn, the unselected word line WLn−1 adjacent to the selected word line WLn, and the dummy word line WLDS are applied with the voltage Vx. At this time, at least a portion of the unselected word lines WLn−2 to WL0 included in the range S are not applied with the voltage Vx.

Moreover, at time t22, the select gate line SGD is applied with the voltage VSGD, and the selected word line WLn, the unselected word line WLn+1 adjacent to the selected word line WLn, and the dummy word line WLDD are applied with the voltage Vx. At this time, at least a portion of the unselected word lines WLn+2 to WL63 included in the range D are not applied with the voltage Vx. In other respects, the operation is similar to the operation of the embodiment shown in FIG. 9. Such a voltage application too causes the select gate transistors SG0 and SG1 to be rendered conductive, and a current to flow from the common source line CELSRC side or the bit line BL side, whereby the body of the unselected NAND string 4 is charged.

[Advantages]

In the write operation of the example shown in FIG. 10 too, when charging the unselected NAND string 4 connected to the bit line BLn, the voltage VSRC of the common source line CELSRC is used to execute the charging operation from the common source line CELSRC side, that is, from the source side. Then, at a different timing to the charging operation from the source side, the voltage VBLC_i of the bit line BL is used to execute the charging operation on the unselected NAND string 4 from the bit line BL side, that is, from the drain side, too.

Now, depending on a data holding state or other characteristics of the memory cell MC included in the range S or the range D, the NAND string 4 can be charged without the word line WL being applied with a voltage. Therefore, the charging operation as in the present example also enables the body of the unselected NAND string 4 to be sufficiently charged. Moreover, in both the case of executing the charging operation from the common source line CELSRC side, that is, from the source side, and the case of executing the charging operation from the bit line BLn side, that is, from the drain side, the selected word line WLn is applied with the voltage Vx, thereby making it possible for a body portion immediately below the selected word line WLn to be sufficiently charged.

Yet Another Example of Embodiment

Next, yet another example of the present embodiment will be described with reference to FIG. 11.

Figure 11:
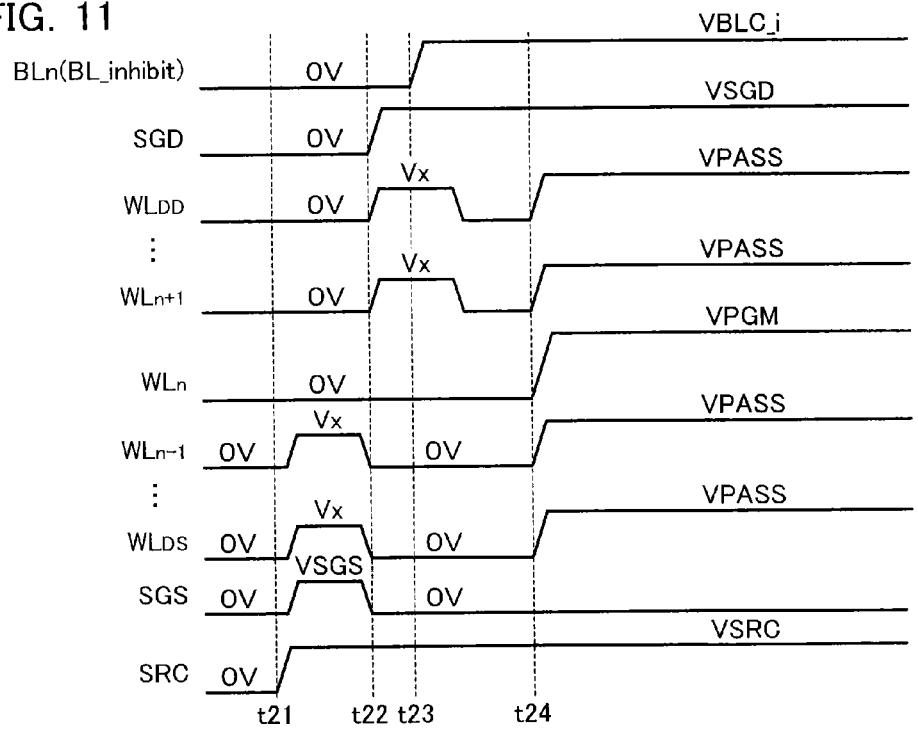
FIG. 11 is a timing chart explaining a write operation of a nonvolatile semiconductor memory device according to another example of the second embodiment.

The write operation of the example shown in FIG. 11 differs from the operation of the embodiment shown in FIG. 9 in that in the write operation of the example shown in FIG. 11, in both the case of executing the charging operation from the common source line CELSRC side, that is, from the source side, and the case of executing the charging operation from the bit line BLn side, that is, from the drain side, the selected word line WLn is not applied with a voltage.

As shown in FIG. 11, at time t21, the common source line is applied with the voltage VSRC. In addition, the select gate line SGS is applied with the voltage VSGS, and the unselected word line WLn−1 adjacent to the selected word line WLn, the unselected word lines WLn−2 to WL0 included in the range S, and the dummy word line WLDS are applied with the voltage Vx. At this time, the selected word line WLn is not applied with the voltage Vx.

Moreover, at time t22, the select gate line SGD is applied with the voltage VSGD, and the unselected word line WLn+1 adjacent to the selected word line WLn, the unselected word lines WLn+2 to WL63 included in the range D, and the dummy word line WLDD are applied with the voltage Vx. At this time, the selected word line WLn is not applied with the voltage Vx. In other respects, the operation is similar to the operation of the embodiment shown in FIG. 9. Such a voltage application too enables the body of the unselected NAND string 4 to be charged.

[Advantages]

In the write operation of the example shown in FIG. 11 too, when charging the unselected NAND string 4 connected to the bit line BLn, the voltage VSRC of the common source line CELSRC is used to execute the charging operation from the common source line CELSRC side, that is, from the source side. Then, at a different timing to the charging operation from the source side, the voltage VBLC_i of the bit line BL is used to execute the charging operation on the unselected NAND string 4 from the bit line BL side, that is, from the drain side, too. If the unselected NAND string 4 can be sufficiently charged without the selected word line WLn being applied with a voltage, control where the selected word line WLn is not applied with a voltage is also possible.

The above-described examples may also be executed in various combinations with each other. For example, the selected word line WLn may be applied with the voltage Vx, only when the voltage VBLC_i of the bit line BLn is used to execute the charging operation from the bit line BLn side, that is, from the drain side.

Third Embodiment

Next, a third embodiment of the present invention will be described with reference to FIG. 12. An overall configuration of a nonvolatile semiconductor memory device of the third embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. In the present embodiment, an order of the charging operation on the unselected NAND string 4 from the common source line CELSRC side, that is, from the source side, and the charging operation on the unselected NAND string 4 from the bit line BL side, that is, from the drain side, differs from that in the second embodiment. The write operation of the nonvolatile semiconductor memory device according to the present embodiment will be described below with reference to FIG. 12.

When performing the write operation of the present embodiment too, the body of the unselected NAND string 4 connected to the unselected bit line BLn (and unselected bit lines BL not illustrated) is charged. As shown in FIG. 12, first, at time t31, the select gate line SGD is applied with the voltage VSGD, and the selected word line WLn, the unselected word line WLn+1 adjacent to the selected word line WLn, the unselected word lines WLn+2 to WL63 included in the range D, and the dummy word line WLDD are applied with the voltage Vx. In addition, the bit line BLn connected to the unselected NAND string 4 is applied with the voltage VBLC_i. This voltage application causes the select gate transistor SG1 to be rendered conductive, and a current to flow from the bit line BL side, whereby the body of the unselected NAND string 4 is charged. At this time, the select gate line SGS is not applied with a voltage, hence the select gate transistor SG0 is in a non-conductive state. Additionally at time t31, the common source line CELSRC is applied with the voltage VSRC.

Next, at time t32, the selected word line WLn, the unselected word line WLn+1, the unselected word lines WLn+2 to WL63 included in the range D, the dummy word line WLDD, and the select gate line SGD are discharged. Additionally at time t32, the select gate line SGS is applied with the voltage VSGS, and the unselected word line WLn−1 adjacent to the selected word line WLn, the unselected word lines WLn−2 to WL0 included in the range S, and the dummy word line WLDS are applied with the voltage Vx. This voltage application causes the select gate transistor SG0 to be rendered conductive, and a current to flow from the common source line CELSRC side, whereby the body of the unselected NAND string 4 is charged. At this time, the select gate line SGD is not applied with a voltage, hence the select gate transistor SG1 is in a non-conductive state.

Then, the select gate line SGS, the unselected word line WLn−1, the unselected word lines WLn−2 to WL0 included in the range S, and the dummy word line WLDS are discharged.

The operation at time t33 and after is similar to the write operation of the second embodiment explained using FIG. 9. In this case too, the voltage of the body of the unselected NAND string 4 is charged, hence even if the selected word line WLn is applied with the write voltage VPGM, the charge accumulation layer of the memory cell MCn included in the unselected NAND string 4 is not applied with a high voltage, and the write operation is not executed.

[Advantages]

Figure 12:
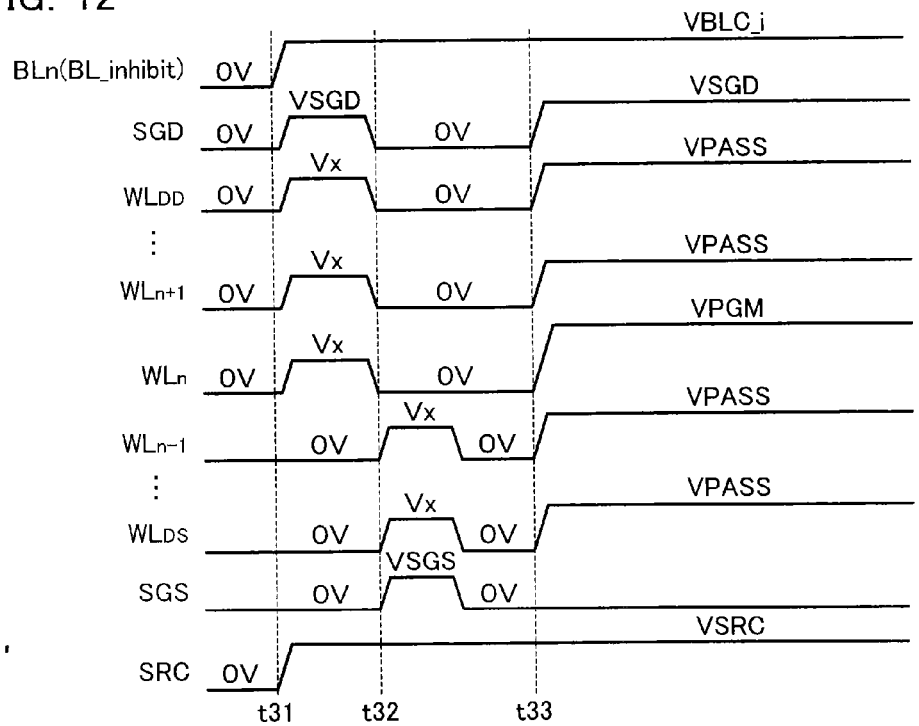
FIG. 12 is a timing chart explaining a write operation of a nonvolatile semiconductor memory device according to a third embodiment.

Due to the write operation of the present embodiment shown in FIG. 12, when charging the unselected NAND string 4 connected to the bit line BLn, the voltage VBLC_i of the bit line BL is used to execute the charging operation on the unselected NAND string 4 from the bit line BL side, that is, from the drain side. Then, at a different timing to the charging operation from the drain side, the voltage VSRC of the common source line CELSRC is used to execute the charging operation on the unselected NAND string 4 from the common source line CELSRC side, that is, from the source side, too. Such a charging operation enables the body of the unselected NAND string 4 to be sufficiently charged, regardless of a state of the unselected NAND string 4, that is, regardless of data held in the memory cell MC in the unselected NAND string 4, and so on.

Note that as shown in the other examples of the second embodiment, in the present embodiment too, when executing the charging operation of the unselected NAND string 4, it can be arbitrarily selected whether the selected word line WLn is applied with the voltage Vx or not, or whether the word lines WL included in the range S and the range D are applied with the voltage Vx or not.

Fourth Embodiment

Next, a fourth embodiment of the present invention will be described with reference to FIGS. 13 and 14. An overall configuration of a nonvolatile semiconductor memory device of the fourth embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. The present embodiment differs from the above-described embodiments in changing whether the unselected NAND string 4 has executed thereon the charging operation from the common source line CELSRC side, that is, from the source side, and the charging operation from the bit line BL side, that is, from the drain side, or not, based on a position of the selected word line WLn in the memory cell array 1.

Figure 13:
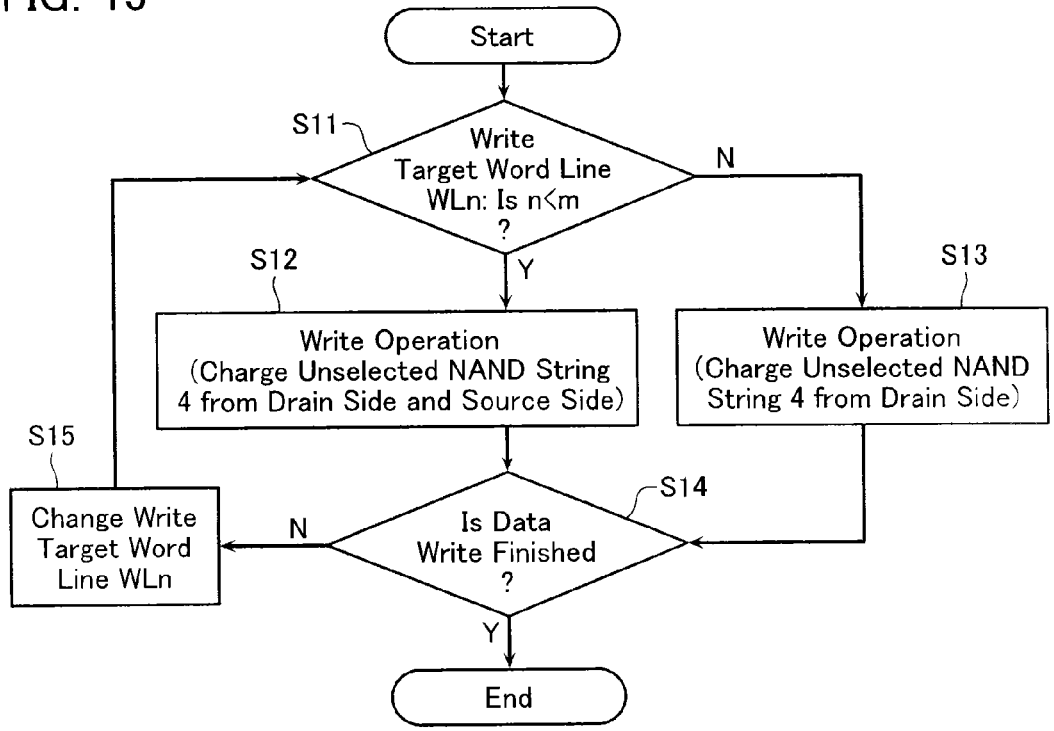
FIG. 13 is a flowchart explaining a write operation of a nonvolatile semiconductor memory device according to a fourth embodiment.

FIG. 13 is a flowchart showing a sequence of the write operation of the present embodiment. The write operation of the present embodiment describes an operation where the write operation is advanced sequentially from the word line WL0 most on a source side in the NAND string 4 of the memory cell array 1. This case leads to a sequence of the kind where the write operation is executed adopting the word line WL0 as the selected word line WLn, and when write to the selected memory cell MCn (MC0) connected to the selected word line WLn (WL0) finishes, the write operation is executed adopting the word line WL1 as the selected word line WLn.

As shown in FIG. 13, when the write operation is started, it is judged at what position in the memory cell array 1 the selected word line WLn that is a write target is located (step S11). This judgment is performed according to whether a value of n of the selected word line WLn is smaller than a certain value m or not.

In the write operation of the present embodiment, if the value of n of the selected word line WLn is smaller than the certain value m, that is, when the selected word line WLn is at a position close to the common source line CELSRC side, both of the charging operation from the common source line CELSRC side, that is, from the source side, and the charging operation from the bit line BL side, that is, from the drain side, are executed on the unselected NAND string 4 (step S12). This charging operation of the unselected NAND string 4 is an operation which is similar to the operation of each of the embodiments described with reference to FIGS. 7 to 12.

In the write operation of the present embodiment, if the value of n of the selected word line WLn is the certain value m or more, that is, when the selected word line WLn is at a position close to the bit line BL side, only the charging operation from the bit line BL side, that is, from the drain side, is executed on the unselected NAND string 4 (step S13). This charging operation of the unselected NAND string 4 is an operation which is similar to the operation of the comparative example described with reference to FIG. 6.

After such a write operation is executed, it is judged whether desired data has been written in the memory cell array 1 and the write operation has finished, or not (step S14). If the write operation has not finished, then the selected word line WLn that is the write target is changed to an adjacent word line WL and the write operation is continued (step S15).

[Advantages]

In the write operation of the present embodiment, when the selected word line WLn is at a position close to the common source line CELSRC side, the charging operation from the common source line CELSRC side, that is, from the source side, is executed on the unselected NAND string 4. On the other hand, when the selected word line WLn is at a position far from the common source line CELSRC side, only the charging operation from the bit line BL side, that is, from the drain side, is performed on the unselected NAND string 4, and the charging operation from the common source line CELSRC side, that is, from the source side, is not executed on the unselected NAND string 4.

Executing the charging operation on the unselected NAND string 4 from the common source line CELSRC side, that is, from the source side when the selected word line WLn is at a position close to the common source line CELSRC side makes it possible to efficiently charge the body immediately below the selected word line WLn.

In the present embodiment, when the selected word line WLn is at a position far from the common source line CELSRC side, the charging operation is performed on the unselected NAND string 4 only from the bit line BL side, that is, from the drain side. Omitting the charging operation from the common source line CELSRC side, that is, from the source side in the case where the body immediately below the selected word line WLn can be sufficiently charged by only charging from the bit line BL side makes it possible to reduce a charging time.

Another Example of Embodiment

Next, another example of the present embodiment will be described with reference to FIG. 14. FIG. 14 is a flowchart showing a sequence of the write operation of the present embodiment.

When performing the write operation of the present example too, whether the unselected NAND string 4 has executed thereon the charging operation from the common source line CELSRC side, that is, from the source side, and the charging operation from the bit line BL side, that is, from the drain side, or not, is changed based on what position in the memory cell array 1 the selected word line WLn that is a write target is located at.

Figure 14:
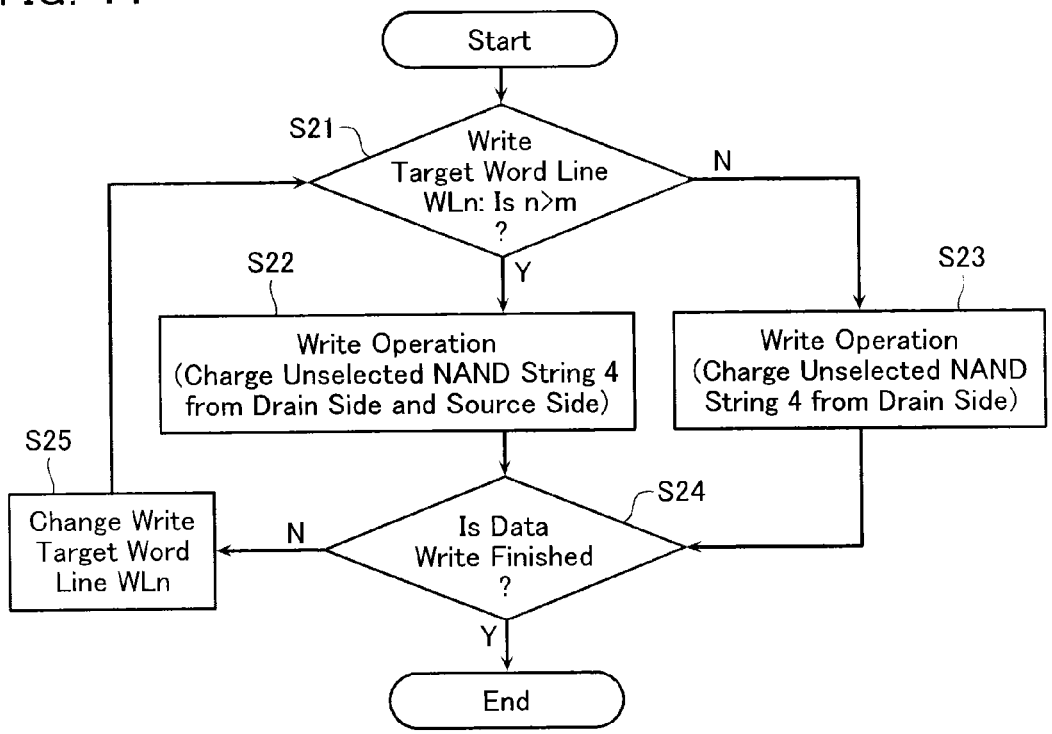
FIG. 14 is a flowchart explaining a write operation of a nonvolatile semiconductor memory device according to another example of the fourth embodiment.

As shown in FIG. 14, when the write operation is started, it is judged at what position in the memory cell array 1 the selected word line WLn that is a write target is located (step S21). Now, the fact that judgment is performed according to whether the value of n of the selected word line WLn is larger than the certain value m or not differs from the above-described embodiment.

In the write operation of the present example, if the value of n of the selected word line WLn is larger than the certain value m, that is, when the selected word line WLn is at a position close to the bit line BL side, both of the charging operation from the common source line CELSRC side, that is, from the source side, and the charging operation from the bit line BL side, that is, from the drain side, are executed on the unselected NAND string 4 (step S22). This charging operation of the unselected NAND string 4 is an operation which is similar to the operation of each of the embodiments described with reference to FIGS. 7 to 12.

In the write operation of the present example, if the value of n of the selected word line WLn is the certain value m or less, that is, when the selected word line WLn is at a position close to the common source line CELSRC side, only the charging operation from the bit line BL side, that is, from the drain side, is executed on the unselected NAND string 4 (step S23). This charging operation of the unselected NAND string 4 is an operation which is similar to the operation of the comparative example described with reference to FIG. 6. An operation sequence after this (steps S24 and S25) is similar to that of the above-described embodiment.

[Advantages]

Depending on effects of data held in the memory cell MC or other characteristics, there are cases when it cannot necessarily be said to be effective to execute the charging operation on the unselected NAND string 4 from the common source line CELSRC side, that is, from the source side too, when the selected word line WLn is at a position close to the common source line CELSRC side. As shown in the operations of FIGS. 13 and 14, during actual operation, it is possible to appropriately adopt the more preferable of whether to execute the charging operation on the unselected NAND string 4 from the common source line CELSRC side, that is, from the source side too, or not, in the case where the selected word line WLn is at a position close to the common source line CELSRC side or a position far from the common source line CELSRC side.

In the present example too, omitting the charging operation from the common source line CELSRC side, that is, from the source side in the case where the body immediately below the selected word line WLn can be sufficiently charged by only charging from the bit line BL side makes it possible to reduce a charging time.

Figure 15:
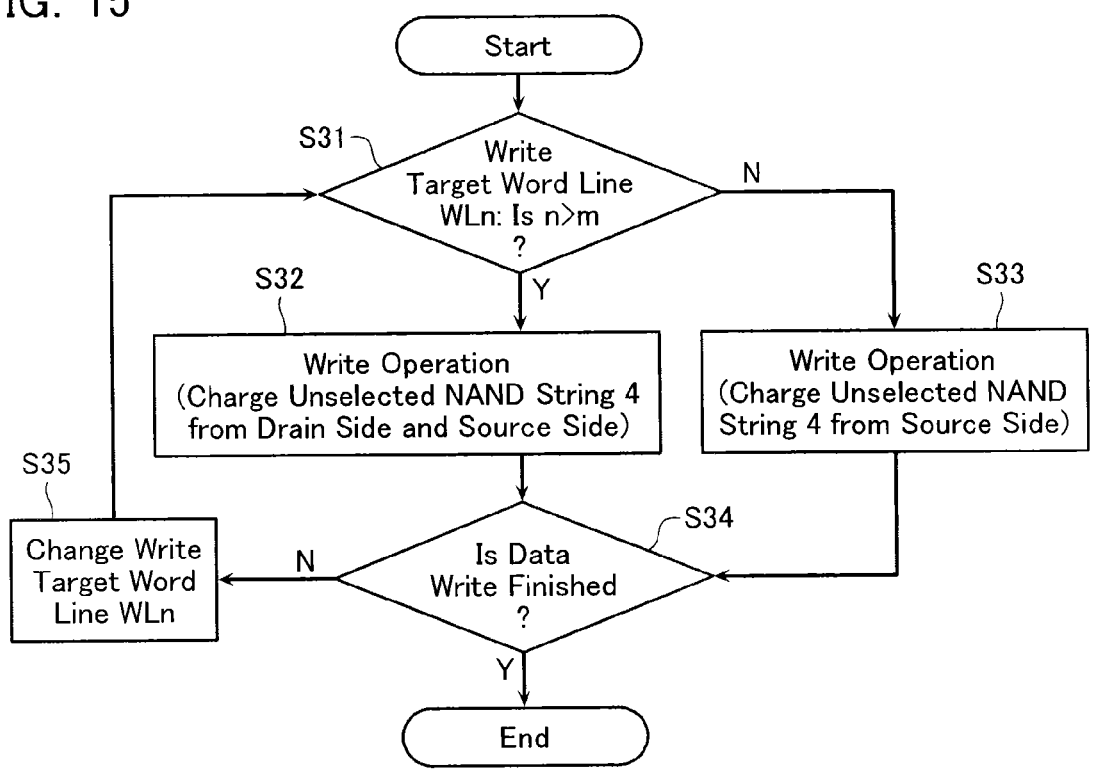
FIG. 15 is a flowchart explaining a write operation of a nonvolatile semiconductor memory device according to another example of the fourth embodiment.

Note that the fourth embodiment and the other example of the embodiment described examples that select whether the unselected NAND string 4 has performed thereon the charge operation from the source side and the drain side, or has performed thereon only the charge operation from the drain side, based on what position in the memory cell array 1 the selected word line WLn that is a write target is located at. Instead of this, it is also possible to execute an operation that selects whether the unselected NAND string 4 has performed thereon the charge operation from the source side and the drain side, or has performed thereon only the charge operation from the source side, based on what position in the memory cell array 1 the selected word line WLn that is a write target is located at. FIG. 15 is a flowchart explaining an operation that selects whether the unselected NAND string 4 has performed thereon the charge operation from the source side and the drain side, or has performed thereon only the charge operation from the source side, based on what position in the memory cell array 1 the selected word line WLn that is a write target is located at. FIG. 15 is similar to the above-described operation of the other example of the embodiment besides the charging operation being performed only from the source side in step S33. Omitting the charging operation from the bit line BL side, that is, from the drain side in the case where the body immediately below the selected word line WLn can be sufficiently charged by only charging from the common source line CELSRC side makes it possible to reduce a charging time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a memory cell array configured having NAND strings arranged therein, each of the NAND strings including: a memory string configured having a plurality of memory cells connected in series therein; and a first select transistor and a second select transistor respectively connected to two ends of the memory string;
    a plurality of word lines respectively connected to control gate electrodes of the plurality of memory cells;
    a first select gate line connected to a control gate electrode of the first select transistor, and a second select gate line connected to a control gate electrode of the second select transistor;
    a plurality of bit lines each connected to a first end of the memory string included in the NAND strings via the first select transistor;
    a source line connected to a second end of the memory string via the second select transistor; and
    a control circuit configured to execute a write operation for data write, the write operation applying a selected memory cell in a selected memory string with a certain write voltage from a selected word line,
    the control circuit being configured to, when charging an unselected memory string prior to the write operation, executing both of a first charging operation and a second charging operation, the first charging operation applying the bit line connected to the unselected memory string with a first voltage and rendering conductive the first select transistor to charge the unselected memory string, and the second charging operation applying the source line with a second voltage and rendering conductive the second select transistor to charge the unselected memory string, the first charging operation and the second charging operation being executed at different timings, and
    wherein a group of word lines positioned between the first selection transistor and the selected word line among the plurality of word lines is a first word line group, and a group of word lines positioned between the selected word line and the second select transistor among the plurality of word lines is a second word line group, and
    the control circuit configured to,
        during the first charging operation, apply the selected word line with a third voltage higher than 0V, apply certain one of the word lines belonging to the first word line group with the third voltage, and apply an other one of the word lines belonging to the first word line group with a fourth voltage lower than the third voltage, or
        during the second charging operation, apply the selected word line with the third voltage, apply certain one of the word lines belonging to the second word line group with the third voltage, and apply an other one of the word lines belonging to the second word line group with the fourth voltage.

2. The nonvolatile semiconductor memory device according to claim 1, wherein
    the control circuit is configured to, during the first charging operation, apply one of the word lines adjacent to the first select gate line with the third voltage.

3. The nonvolatile semiconductor memory device according to claim 1, wherein
    the control circuit is configured to, during the first charging operation, apply one of the word lines belonging to the first word line group adjacent to the selected word line with the third voltage.

4. The nonvolatile semiconductor memory device according to claim 1, wherein
    the control circuit is configured to, during the second charging operation, apply one of the word lines adjacent to the second select gate line with the third voltage.

5. The nonvolatile semiconductor memory device according to claim 1, wherein
    the control circuit is configured to, during the second charging operation, apply one of the word lines belonging to the second word line group adjacent to the selected word line with the third voltage.

6. The nonvolatile semiconductor memory device according to claim 1, wherein
    the control circuit is configured to, during at least one of the first charging operation and the second charging operation, apply the selected memory cell with a fifth voltage from the selected word line.

7. The nonvolatile semiconductor memory device according to claim 1, wherein
    the control circuit is configured to execute the second charging operation prior to the first charging operation.

8. The nonvolatile semiconductor memory device according to claim 1, wherein
the control circuit is configured to, during the first charging operation, render non-conductive the second select transistor, and configured to, during the second charging operation, render non-conductive the first select transistor.

9. The nonvolatile semiconductor memory device according to claim 1, wherein
the control circuit is configured to set a voltage value of the first voltage to a higher value than a voltage value of the second voltage.

10. A nonvolatile semiconductor memory device, comprising:
a memory cell array configured having NAND strings arranged therein, each of the NAND strings including: a memory string configured having a plurality of memory cells connected in series therein; and a first select transistor and a second select transistor respectively connected to two ends of the memory string;
a plurality of word lines respectively connected to control gate electrodes of the plurality of memory cells;
a first select gate line connected to a control gate electrode of the first select transistor, and a second select gate line connected to a control gate electrode of the second select transistor;
a plurality of bit lines each connected to a first end of the memory string included in the NAND strings via the first select transistor;
a source line connected to a second end of the memory string via the second select transistor; and
a control circuit configured to execute a write operation for data write, the write operation applying a selected memory cell in a selected memory string with a certain write voltage from a selected word line,
the control circuit being configured to, when charging an unselected memory string prior to the write operation, executing a first charging operation and a second charging operation, the first charging operation applying the bit line connected to the unselected memory string with a first voltage and rendering conductive the first select transistor to charge the unselected memory string, and the second charging operation applying the source line with a second voltage and rendering conductive the second select transistor to charge the unselected memory string,
the control circuit being configured to change whether to execute both of the first charging operation and the second charging operation or whether to execute one of the first charging operation and the second charging operation, based on a position of the selected word line in the memory cell array, and
wherein a group of word lines positioned between the first selection transistor and the selected word line among the plurality of word lines is a first word line group, and a group of word lines positioned between the selected word line and the second select transistor among the plurality of word lines is a second word line group, and
the control circuit configured to,
during the first charging operation, apply the selected word line with a third voltage higher than 0V, apply certain one of the word lines belonging to the first word line group with the third voltage, and apply other one of the word lines belonging to the first word line group with a fourth voltage lower than the third voltage, or during the second charging operation, apply the selected word line with the third voltage, apply certain one of the word lines belonging to the second word line group with the third voltage, and apply other one of the word lines belonging to the second word line group with the fourth voltage.

11. The nonvolatile semiconductor memory device according to claim 10, wherein
the control circuit is configured to, during the first charging operation, apply one of the word lines adjacent to the first select gate line with the third voltage.

12. The nonvolatile semiconductor memory device according to claim 11, wherein
the control circuit is configured to, during the first charging operation, apply one of the word lines belonging to the first word line group adjacent to the selected word line with the third voltage.

13. The nonvolatile semiconductor memory device according to claim 10, wherein
the control circuit is configured to, during the second charging operation, apply one of the word lines adjacent to the second select gate line with the third voltage.

14. The nonvolatile semiconductor memory device according to claim 10, wherein
the control circuit is configured to, during the second charging operation, apply one of the word lines belonging to the second word line group adjacent to the selected word line with the third voltage.

15. The nonvolatile semiconductor memory device according to claim 10, wherein
the control circuit is configured to, during at least one of the first charging operation and the second charging operation, apply the selected memory cell with a fifth voltage from the selected word line.

16. The nonvolatile semiconductor memory device according to claim 10, wherein
the control circuit is configured to, when the selected word line is at a position close to the source line side in the memory string, execute both of the first charging operation and the second charging operation, and
the control circuit is configured to, when the selected word line is at a position close to the bit line side in the memory string, execute one of the first charging operation and the second charging operation.

17. The nonvolatile semiconductor memory device according to claim 10, wherein
the control circuit is configured to, during the first charging operation, render non-conductive the second select transistor, and configured to, during the second charging operation, render non-conductive the first select transistor.

18. The nonvolatile semiconductor memory device according to claim 10, wherein
the control circuit is configured to set a voltage value of the first voltage to a higher value than a voltage value of the second voltage.

19. A nonvolatile semiconductor memory device, comprising:
a memory cell array configured having NAND strings arranged therein, each of the NAND strings including: a memory string configured having a plurality of memory cells connected in series therein; and a first select transistor and a second select transistor respectively connected to two ends of the memory string;
a plurality of word lines respectively connected to control gate electrodes of the plurality of memory cells;

a first select gate line connected to a control gate electrode of the first select transistor, and a second select gate line connected to a control gate electrode of the second select transistor;

a plurality of bit lines each connected to a first end of the memory string included in the NAND strings via the first select transistor;

a source line connected to a second end of the memory string via the second select transistor; and a control circuit configured to execute a write operation for data write, the write operation applying a selected memory cell in a selected memory string with a certain write voltage from a selected word line, the control circuit being configured to, when charging an unselected memory string prior to the write operation, execute a first charging operation and a second charging operation, the first charging operation applying the bit line connected to the unselected memory string with a first voltage and rendering conductive the first select transistor to charge the unselected memory string, and the second charging operation applying the source line connected to the unselected memory string with a second voltage and rendering conductive the second select transistor to charge the unselected memory string, the control circuit being configured to change whether to execute both of the first charging operation and the second charging operation or whether to execute one of the first charging operation and the second charging operation, based on a position of the selected word line in the memory cell array, the control circuit being configured to, when the selected word line is at a position close to the bit line side in the memory string, execute both of the first charging operation and the second charging operation, and the control circuit being configured to, when the selected word line is at a position close to the source line side in the memory string, execute one of the first charging operation and the second charging operation.

* * * * *